United States Patent
Mori et al.

(10) Patent No.: US 7,592,818 B2
(45) Date of Patent: Sep. 22, 2009

(54) METHOD AND APPARATUS FOR MEASURING SCATTERING COEFFICIENT OF DEVICE UNDER TEST

(75) Inventors: Taishi Mori, Kuastsu (JP); Gaku Kamitani, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 12/039,892

(22) Filed: Feb. 29, 2008

(65) Prior Publication Data

US 2008/0211515 A1    Sep. 4, 2008

Related U.S. Application Data

(63) Continuation of application No. PCT/JP2006/316465, filed on Aug. 23, 2006.

(30) Foreign Application Priority Data

Sep. 1, 2005    (JP) .............................. 2005-253158

(51) Int. Cl.
*G01R 27/04*    (2006.01)
*G01R 27/32*    (2006.01)
*G01R 27/28*    (2006.01)

(52) U.S. Cl. ...................... 324/638; 324/650
(58) Field of Classification Search ................ 324/601, 324/638, 650
See application file for complete search history.

(56) References Cited

U.S. PATENT DOCUMENTS 4,521,728 A *  6/1985  Li ............................... 324/638

6,960,920 B2 * 11/2005 Kamitani .................... 324/601
2004/0075441 A1 *  4/2004 Jecko et al. ................ 324/538

FOREIGN PATENT DOCUMENTS

| JP | 7-198767 | 8/1995 |
|----|----------|--------|
| JP | 2003-215183 | 7/2003 |
| JP | 2004-198415 | 7/2004 |
| JP | 3540797 | 7/2004 |

OTHER PUBLICATIONS

PCT/JP2006/316465 International Search Report dated Dec. 6, 2006.
PCT/JP2006/316465 Written Opinion dated Dec. 6, 2006.
G.F. Engen, "The Six-Port Reflectometer: An Alternative Work Analyzer, " IEEE Transactions on Microwave Theory and Techniques, vol. MTT-25, No. 12, pp. 1075-1080, Dec. 1977.

* cited by examiner

*Primary Examiner*—Amy He
(74) *Attorney, Agent, or Firm*—Dickstein Shapiro LLP

(57) ABSTRACT

A measuring method and measurement system that includes a signal source that applies a signal to a device under test, a scalar measuring instrument that measures a reflected wave reflected from the device under test or a transmitted wave transmitted through the device under test as a scalar value, and a superimposing signal system that superimposes three different vector signals whose relation values are specified in advance on the reflected wave or the transmitted wave of the device under test. The three vector signals are superimposed on the reflected wave or the transmitted wave of the device under test, and the superimposed signals are each measured as a scalar value by the electric-power measuring instrument. The three measured scalar values are converted into a single vector value using the specified relation values of the three vector signals, thereby obtaining a transmission coefficient of the device under test.

10 Claims, 9 Drawing Sheets

METHOD AND APPARATUS FOR MEASURING SCATTERING COEFFICIENT OF DEVICE UNDER TEST

CROSS REFERENCE TO RELATED APPLICATIONS

The present application is a continuation of International Application No. PCT/JP2006/316465, filed Aug. 23, 2006, which claims priority to Japanese Patent Application No. JP2005-253158, filed Sep. 1, 2005, the entire contents of each of these applications being incorporated herein by reference in their entirety.

FIELD OF THE INVENTION

The present invention relates to a method and apparatus for vector-measuring a scattering coefficient of a device under test (DUT), such as an electronic device.

BACKGROUND OF THE INVENTION

The operating frequency of high-frequency electronic circuits is increasing more and more, so it is necessary to accurately measure electric characteristics of an electronic device used in such a circuit in a high frequency range. Among items to be measured at high frequencies, a reflection coefficient and a transmission coefficient are important. A reflection coefficient is the ratio of a wave reflected from a DUT to an incident wave applied to the DUT. A transmission coefficient is the ratio of a wave transmitted through a DUT to an incident wave applied to the DUT. They are all vector values (or complex quantities). However, in terms of actual use, only amplitude information (scalar values) for each is important in most cases.

When a wave reflected from or transmitted through a DUT is observed by a measurement system, ordinarily, it has many errors of the measurement system. By removal of the errors of the measurement system from an observed amount, true characteristics of a DUT can be obtained. To do this, it is necessary to observe the reflected wave or transmitted wave as a vector value (to vector-measure). If only amplitude information (scalar value) for them is observed, it is difficult to accurately remove errors of the measurement system. In other words, although only the amplitude for a reflection coefficient or transmission coefficient is important in terms of actual use, a vector value is required to accurately measure them.

A vector network analyzer (VNA) is typically used in vector measurement of high-frequency characteristics in the extremely high frequency or higher range. To determine a matrix of scattering coefficients (e.g., a reflection coefficient and a transmission coefficient), a VNA applies a measurement signal to a DUT and measures the amplitude ratio of each of a reflected wave and a transmitted wave to the measurement signal and the phase difference between the measurement signal and each of the reflected wave and the transmitted wave. That is, a VNA is a measuring instrument in which a signal source and a vector detector are combined. A known VNA employs a heterodyne detecting scheme using, as an important part of a structure of the vector detector, a phase locked loop (PLL) that includes a local oscillator and a mixer.

However, for the structure of the VNA, there is a problem of a considerable increase in cost caused by an increase in the number of stages of the local oscillator and mixer of the PLL with a rise of a measured frequency or by other reasons. In addition, an increase in frequency leads to a loss occurring in frequency conversion and a decrease in the purity of a measurement signal, thus resulting in a problem in which a high-precision measurement is difficult.

Non-Patent Document 1 discusses a process for measuring electric power with a measurement system that performs four measurements on an incident wave and reflected wave and deriving a phase difference from the four measurement values of electric power using a system parameter of the measurement system. For this process, the phase difference, which becomes more difficult to be measured as the frequency increases, is derived based on measurement of a scalar value being an electric-power value being a fundamental measured volume in measurement of electromagnetic waves, the measurement accuracy being virtually independent of frequency. This can remove the above-described drawbacks in a VNA. However, it is necessary to measure four electric powers by four electric-power measuring instruments to measure reflection, so there is a problem in which the overall size of a measuring instrument is increased and the cost is also increased.

Patent Document 1 describes a process for improving the measurement accuracy by increasing the number of electric-power measurement values from four to five and making it possible to compare the amplitude ratios between an incident wave and a reflected wave using a basic measurement principle similar to that in Non-Patent Document 1. In this process, five electric powers are measured by five electric-power measuring instruments to measure reflection. This causes a further increase in the overall size of a measuring instrument, and also raises the cost.

Non-Patent Document 1: G. F. Engen, "The six-port reflectometer: An alternative network analyzer, "IEEE Transactions on Microwave Theory and Techniques, vol. MTT-25, no. 12, pp. 1075-1080, December 1977
Patent Document 1: Japanese Patent No. 3540797

SUMMARY OF THE INVENTION

Accordingly, an object of preferred embodiments of the present invention is to provide a measuring method and measuring apparatus for vector-measuring a scattering coefficient of a device under test substantially using a scalar measuring instrument while enabling a reduction in the size of the measuring instrument and the cost.

A first preferred embodiment of the present invention is a measuring method for vector-measuring a scattering coefficient of a device under test. The measuring method includes a first step of preparing a measurement system, the measurement system including a signal source that applies a signal to the device under test, a scalar measuring instrument that measures a reflected wave reflected from the device under test or a transmitted wave transmitted through the device under test as a scalar value, and a superimposing signal system that superimposes at least three different vector signals on the reflected wave or the transmitted wave of the device under test, a second step of specifying a relation value of each of the at least three vector signals as a vector value, a third step of superimposing the at least three vector signals on the reflected wave or the transmitted wave of the device under test and measuring each of superimposed signals as a scalar value using the scalar measuring instrument, and a fourth step of converting at least three scalar values measured in the third step into at least one vector value using the relation values obtained in the second step and determining a scattering coefficient of the device under test.

A second preferred embodiment of the present invention is a measuring apparatus for vector-measuring a scattering coefficient of a device under test. The measuring apparatus includes a signal source that applies a signal to the device under test, a superimposing signal system that superimposes at least three different vector signals whose relation values are each specified as a vector value on a reflected wave reflected from the device under test or a transmitted wave transmitted through the device under test, a scalar measuring instrument that measures each of superimposed signals in which the at least three vector signals are superimposed on the reflected wave or the transmitted wave of the device under test as a scalar value, and converting means that converts at least three scalar values measured by the scalar measuring instrument into at least one vector value using the specified relation values of the at least three vector signals and determines a scattering coefficient of the device under test.

A fundamental idea of the present invention is that, in measurement of a reflected wave reflected from a DUT and/or a transmitted wave transmitted through the DUT, at least three scalar measurements corresponding to different states of a measurement system are performed and a vector value, that is, a scattering coefficient is mathematically determined from at least three obtained scalar values. To perform the measurements, the measurement system is prepared so as to have a switchable signal path so that that at least three different vector signals can be superimposed on the reflected wave and/or transmitted wave. A relation value of each of the vector signals is specified as a vector in advance. Here, examples of a vector signals that can be superimposed include a directional error and a leakage error. It is not necessary to specify a phase of each of the vector signals and absolute positions. It is only required to know their relationship. Then, by performance of a scalar measurement of the reflected wave and/or transmitted wave of the DUT using the measurement system when the three vector signals are switched, superimposed signals of the reflected wave and/or transmitted wave of the DUT and the vector signals can be measured as scalar values. From the measured superimposed scalar values and the relation values of the three vector signals, a reflection coefficient (vector value) or a transmission coefficient (vector value) of the DUT can be determined by calculation.

The present invention determines one scattering coefficient (vector value) from specified relation values (vector values) of three vector signals and measured values of superimposed signals in which the three vector signals are superimposed on a reflected wave reflected from a DUT and/or a transmitted wave transmitted through the DUT each measured as a scalar value. This scattering coefficient can be obtained as the intersection of three circles having their centers corresponding to the specified relation values and radii corresponding to the measured scalar values on the complex plane. In reality, however, the three circles may not intersect at one point, and may intersect at two or more points because of measurement errors or other reason. In this case, a final scattering coefficient (vector value) can be determined by, for example, determining the barycenter of three intersections lying within a predetermined circle.

For the present invention, it is necessary to specify a relation value of each of three vector signals (for example, directional errors or leakage errors) as a vector. For this reason, a vector measuring instrument (for example, a VNA) may be used, or alternatively, it is possible to derive the value using only a scalar measuring instrument by carrying out an original calibration procedure described below. Relation values of three vector signals can be specified only once in manufacturing the measuring apparatus, and subsequent measurement of a DUT can be performed using the specified relation values. Even if the DUT is replaced with another, it is not necessary to respecify them.

The present invention reveals that a vector measured value (scattering coefficient) of a reflected wave and/or transmitted wave in a high frequency range can be substantially obtained by a scalar value measurement that is an inexpensive basic measurement virtually independent of frequency (electric power measurement using a power meter or a power sensor, voltage measurement using a voltmeter, current measurement using an ammeter). Here, a scalar measuring instrument performing a scalar measurement is a measuring instrument that measures only amplitude information (magnitude of amplitude) on electric power, voltage, or current. In the case of high-frequency devices, which are often produced by small-lot production of a wide variety of products, with an inexpensive measuring instrument according to the present invention, it is possible to prepare it for each device, and this can reduce the burden on a step, such as a changeover. The characteristics described above provide a considerable advantage to ensuring of the reproducibility of measurement in measurement in a high frequency range at or above the extremely high frequency band, which requires fine adjustment of a measurement system. The present invention can perform vector error correction while suppressing an increase in the price of a measurement system as long as electric power measurement, which is basically thermal measurement, is possible. A technique of the present invention is not multiplicative phase detection using a mixer or sampler but additive phase detection making use of a change in a measured value during load fluctuations. Therefore, essentially, there is no limit to the input bandwidth. Accordingly, there is a possibility that it can be extended to a frequency band of light.

In superimposing at least three vector signals on a reflected wave reflected from a DUT or a transmitted wave transmitted through the DUT, three states can be easily obtained by provision of at least three directional errors or leakage errors and directional error selector means or leakage error selector means that selects among those errors. It is not necessary to prepare a scalar measuring instrument for each of the states to obtain a measured value in the three states, and a single measuring instrument is sufficient. Accordingly, unlike a system that requires a large number of electric-power measuring instruments, as in Non-Patent Document 1 and Patent Document 1, the overall size of a measuring apparatus can be reduced, and the cost can also be reduced.

A reflection coefficient measurement system can be easily constructed by provision of a coupler (directional coupler) in a measurement signal path joining a signal source and a DUT, attachment of directional errors that can be switched among at least three states to a first port of another signal path joined to the measurement signal path by the coupler, and connection of a reflected-wave scalar measuring instrument to a second port thereof. A transmission coefficient measurement system can be easily constructed by connection of a signal path in which a DUT is present and a signal path in which leakage errors that can be switched among at least three states is present in parallel between a signal source and a transmitted-wave scalar measuring instrument. In addition, a one-path two-port measurement system can be constructed by combination of a reflection coefficient measurement system and a transmission coefficient measurement system. A full two-port measurement system and a full three-port measurement system can also be constructed by switching of a signal source using a switch. In this case, both scattering coefficients, i.e., a reflection coefficient and a transmission coefficient, can be measured at the same time by switching among directional errors and leakage errors using selector means while maintaining connection between the DUT and the measurement system.

In the foregoing description, a method of superimposing at least three vector signals on a reflected wave reflected from a DUT or a transmitted wave transmitted through the DUT is described. However, a method of superimposing two vector signals can be used. In this case, since there are only two vector signals for use in superimposed signals, basically, two vector values are derived, so a scattering coefficient (vector value) of the DUT cannot be uniquely determined. However, if approximate characteristics are known, only one vector value is selectable from two converted vector values, so a scattering coefficient can be determined from the selected value. When both of the two derived vector values are not within a particular range from standard characteristics of a DUT sample (for example, within the range of conforming items), the device can be determined as a defective item during screening in mass production. The time required for derivation of a scattering coefficient in this method can be shorter than that in the above-described example, which requires three scalar measurements, because only two scalar measurements are necessary.

As described above, according to the first embodiment of the present invention, at least three scalar value measurements corresponding to different states of a measurement system are performed in measurement of a reflected wave reflected from a DUT and/or a transmitted wave transmitted through the DUT, and a scattering coefficient is mathematically determined from three obtained scalar measured values. That is, a scattering coefficient of the reflected wave and/or transmitted wave in a high frequency range can be substantially obtained by a scalar value measurement that is an inexpensive basic measurement virtually independent of frequency. As a result, unlike a VNA, there is no problem in which the price significantly increases with an increase in a measured frequency, and an increase in frequency does not lead to a loss occurring in frequency conversion and a decrease in the purity of a measurement signal. The number of scalar measuring instruments can also be reduced, compared with a vector measurement technique using a known electric-power measuring instrument, so the overall size of a measuring apparatus and the cost can be reduced.

According to the second embodiment of the present invention, two vector signals are superimposed on a reflected wave reflected from a DUT and/or a transmitted wave transmitted through the DUT, superimposed signals are each measured as a scalar value by a scalar measuring instrument, and the two obtained scalar values are converted into two vector values using relation values of the two vector signals. A scattering coefficient of the DUT can be determined from one of the two converted vector values. Therefore, the number of times measurements are performed can be reduced, and thus the time required for the measurements can be shortened.

DETAILED DESCRIPTION OF THE INVENTION

Preferred embodiments of the present invention are described below with reference to the drawings.

First Preferred Embodiment

Figure 1:
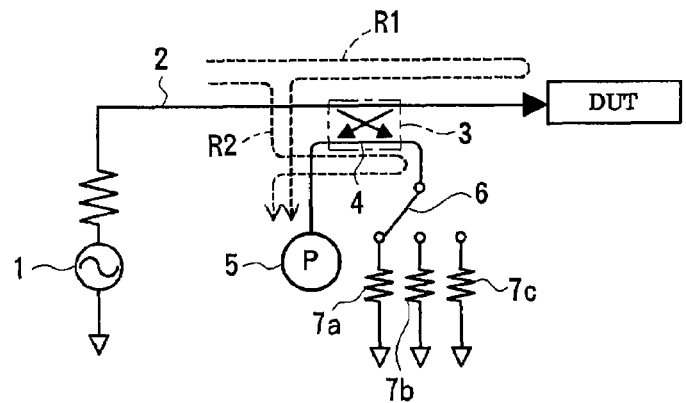
FIG. 1 is a schematic circuit diagram for measuring a reflection coefficient according to a first embodiment of the present invention.

FIG. 1 illustrates an apparatus for measuring a reflection coefficient of a DUT according to a first preferred embodiment of the present invention. A signal generated by a signal source 1 including an oscillator passes through a measurement signal path 2 and is applied to a DUT. A coupler 3 separating part of signals passing through the measurement signal path 2 is disposed in the measurement signal path 2. A first port of an error signal path 4 coupled to the measurement signal path 2 by the coupler 3, the first port being adjacent to the signal source, is connected to an electric-power measuring instrument 5 measuring a reflected wave as a scalar value, such as a power meter. A second port of the error signal path 4, the second port being adjacent to the DUT, is connected to three kinds of directional errors 7a to 7c via a directional selector switch 6. The directional errors 7a to 7c have different reflection phases from each other, and relation values thereof (relative vector values) are determined in advance.

Figure 2:
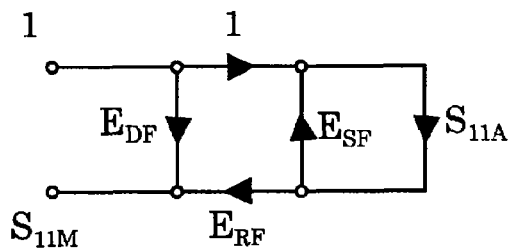
FIG. 2 illustrates an error model of measurement of a reflection loss.

FIG. 2 illustrates an error model of measurement of a reflection loss. $S_{11A}$ represents a reflection loss of a DUT, $S_{11M}$ represents a measured value of the reflection loss, $E_{DF}$ represents a directional error, $E_{RF}$ represents a reflection frequency response error, and $E_{SF}$ represents a source match error. From the error model illustrated in FIG. 2, the relationship between the reflection loss $S_{11A}$ of a DUT and the measured value $S_{11M}$ is expressed by the following:

$$S_{11M} = E_{DF} + \frac{E_{RF} S_{11A}}{1 - E_{SF} S_{11A}} \qquad \text{(Eq. 1)}$$

Here, the reflection loss $S_{11A}$ to be measured for many DUTs are of the order of approximately −15 dB to −20 dB, and $E_{SF}$ can be reduced to the order of −20 dB to −25 dB by implementation of a probe. Accordingly, $E_{SF}S_{11A}$ is a significantly small value of −35 dB to −45 dB, compared with a measurement signal level of 0 dB. Therefore, it can be approximated to the following expression.

$$S_{11M} = E_{DF} + E_{RF} S_{11A} \qquad \text{(Eq. 2)}$$

The error regarding $E_{RF}$ in Equation 2 can be corrected by determination of a correction coefficient from the previously specified scalar values of a DUT. However, the directional error $E_{DF}$ cannot be corrected by a typical scalar measurement. In the present invention, the following steps are performed to correct the directional error $E_{DF}$ even using a scalar measurement. In reality, if the value $\Gamma_T$ in which $E_{DF}$ is eliminated from $S_{11M}$ can be obtained, because $\Gamma_T$ is a vector measured value, errors of $E_{RF}$ and $E_{SF}$ can be removed by carrying out an ordinal error removal procedure. That is, the assumption described above is not necessarily required, so the present invention is applicable even if $E_{SF}S_{11A}$ cannot be negligible.

A process for measuring a reflection coefficient of a DUT will now be described.

—Specifying Directional Errors—

Relation values ($E_{DF1}$, $E_{DF2}$, and $E_{DF3}$) of the three directional errors 7a to 7c can be determined by, for example, actual measurement using a calibrated VNA. Alternatively, the relation values of the three directional errors can be determined by carrying out an original calibration procedure described below without measurement using the VNA. For example, in the case of determination of the relation values of the three directional errors using a two-port VNA, a reflection-free termination is prepared in addition to the VNA. A port 1 of the VNA is connected to a signal source side illustrated in FIG. 1, the reflection-free termination is connected to a DUT side, and a port 2 of the VNA is connected to an electric-power measuring instrument side. In this state, three measured values $S_{21}$ of a transmission coefficient measured when the directional selector switch 6 is switched to each of the three positions are the relation values of the three directional errors. Once the measuring apparatus has been produced, the three directional errors specified in this way will not be changed in ordinary cases. Therefore, when the values are specified in the production of the measuring apparatus, the specified values can be used continuously thereafter. As a result, the VNA is not necessary in a mass-production process of devices using the measuring apparatus.

—Scalar Measurement—

After the completion of specification of the directional errors 7a to 7c, the measuring apparatus illustrated in FIG. 1 is connected to a DUT, and reflection measurement is performed. More specifically, electric-power values (scalar values) of a reflected wave in three states selected by the directional selector switch 6 are measured by the electric-power measuring instrument 5. The measured values are the amplitudes of superimposed signals of a reflected wave R1 reflected from the DUT and reflected waves R2 reflected from the directional errors 7a to 7c.

—Conversion from Scalar Values to Vector Value—

Conversion into a single vector value, that is, the reflection coefficient $\Gamma_T$ is performed using the previously specified vector values of the three directional errors ($E_{DF1}$, $E_{DF2}$, and $E_{DF3}$) and three electric-power values ($|\Gamma_{m1}|$, $|\Gamma_{m2}|$, and $|\Gamma_{m3}|$). A derivation of the conversion expression will be described below.

When the real part and the imaginary part of each vector value are represented with the suffixes x and y, respectively, ($E_{DF1}$, $E_{DF2}$, and $E_{DF3}$) and $\Gamma_T$ are represented by the following:

$E_{DF1} = (E_{DF1x}, E_{DF1y})$ $E_{DF2} = (E_{DF2x}, E_{DF2y})$ $E_{DF3} = (E_{DF3x}, E_{DF3y})$ $\Gamma_T = (\Gamma_{Tx}, \Gamma_{Ty})$ Because the amplitude at a point where a directional error is added to a vector measured value is a reflection coefficient scalar measured value, when a possible value of the vector measured value $\Gamma_T$ is expressed by (x, y), the relational expressions of the three directional errors ($E_{DF1}$, $E_{DF2}$, and $E_{DF3}$), the three reflection coefficient scalar measured values ($|\Gamma_{m1}|$, $|\Gamma_{m2}|$, and $|\Gamma_{m3}|$) of the DUT, and the vector measured value $\Gamma_T$, in which each of the directional errors is eliminated, are represented by Equations 3 to 5.

$$|\Gamma_{m1}|^2 = (x + E_{DF1x})^2 + (y + E_{DF1y})^2 \qquad \text{(Eq. 3)}$$

$$|\Gamma_{m2}|^2 = (x + E_{DF2x})^2 + (y + E_{DF2y})^2 \qquad \text{(Eq. 4)}$$

$$|\Gamma_{m3}|^2 = (x + E_{DF3x})^2 + (y + E_{DF3y})^2 \qquad \text{(Eq. 5)}$$

On the assumption that the vector measured value $\Gamma_T$ simultaneously satisfying Equations 3 to 5 exists, a derivation of the vector measured value $\Gamma_T$ satisfying the three equations will be described below. When the simultaneous equations are solved using a typical process, four solutions are obtained, and two matching solutions are the vector measured value $\Gamma_T$. However, computational complexity for obtaining the four solutions in this process is very large, so it tends to increase errors by cancellation of significant digits of a computer. To address this, the vector measured value $\Gamma_T$ is derived using a geometric process described below.

Figure 3:
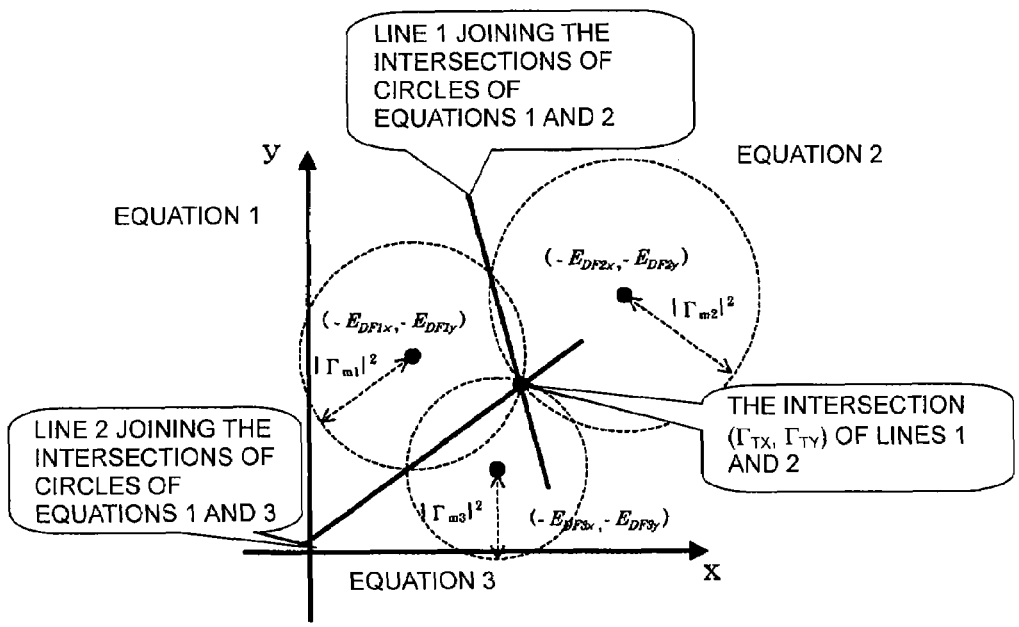
FIG. 3 is an illustration for describing a process for deriving a vector measured value from three scalar measured values and directional errors.

Equations 3 to 5 can be considered as three circles each having its center coordinates (x−$E_{DFx}$, y−$E_{DFy}$) and radius $|\Gamma_m|$. From the assumption that the vector measured value $\Gamma_T$ simultaneously satisfying Equations 3 to 5 exists, a common intersection of the three circles exists and the intersection is the vector measured value $\Gamma_T$. Therefore, as illustrated in FIG. 3, the vector measured value $\Gamma_T$ can be derived by derivation of two equations of straight lines each passing through intersections of two circles (for example, a straight line passing through the intersections of circles of Equations 3 and 4 and a straight line passing through circles of Equations 3 and 5) and determination of an intersection of the straight lines.

The equations of the two straight lines are shown below.
By subtracting Equation 4 from Equation 3, $$|\Gamma_{m1}|^2 - |\Gamma_{m2}|^2 = 2x(E_{DF1x} - E_{DF2x}) + 2y(E_{DF1y} - E_{DF2y}) + E_{DF1x}^2 + E_{DF1y}^2 - E_{DF2x}^2 - E_{DF2y}^2 \quad \text{(Eq. 6)}$$

By subtracting Equation 5 from Equation 3, $$|\Gamma_{m1}|^2 - |\Gamma_{m3}|^2 = 2x(E_{DF1x} - E_{DF3x}) + 2y(E_{DF1y} - E_{DF3y}) + E_{DF1x}^2 + E_{DF1y}^2 - E_{DF3x}^2 - E_{DF3y}^2 \quad \text{(Eq. 7)}$$

When the coordinates $(\Gamma_{Tx}, \Gamma_{Ty})$ of the intersection is derived from Equations 6 and 7 being the equations of the two straight lines, Equations 8 and 9 are obtained.

$$\Gamma_{Tx} = \{E_{DF1y}*(|\Gamma_{m2}|^2 - |\Gamma_{m3}|^2 + E_{DF3x}^2 + E_{DF3y}^2 - E_{DF2x}^2 - E_{DF2y}^2) + E_{DF2y}*(|\Gamma_{m3}|^2 - |\Gamma_{m1}|^2 + E_{DF1x}^2 + E_{DF1y}^2 - E_{DF3x}^2 - E_{DF3y}^2) + E_{DF3y}*(|\Gamma_{m1}|^2 - |\Gamma_{m2}|^2 + E_{DF2x}^2 + E_{DF2y}^2 - E_{DF1x}^2 - E_{DF1y}^2)\}/\{2*(E_{DF1x}E_{DF3y} + E_{DF2x}E_{DF1y} + E_{DF3x}E_{DF2y} - E_{DF1x}E_{DF2y} - E_{DF2x}E_{DF3y} - E_{DF3x}E_{DF1y})\} \quad \text{(Eq. 8)}$$

$$\Gamma_{Ty} = \{|\Gamma_{m1}|^2 - |\Gamma_{m2}|^2 + E_{DF2x}^2 + E_{DF2y}^2 - E_{DF1x}^2 - E_{DF1y}^2 - 2\Gamma_{Tx}*(E_{DF1x} - E_{DF2x})\}/\{2*(E_{DF1y} - E_{DF2y})\} \quad \text{(Eq. 9)}$$

As described above, the vector measured value $(\Gamma_{Tx}, \Gamma_{Ty})$, in which the directional errors are removed from the three reflection coefficient scalar measured values ($|\Gamma_{m1}|$, $|\Gamma_{m2}|$, and $|\Gamma_{m3}|$) of the DUT, can be obtained.

Figure 4:
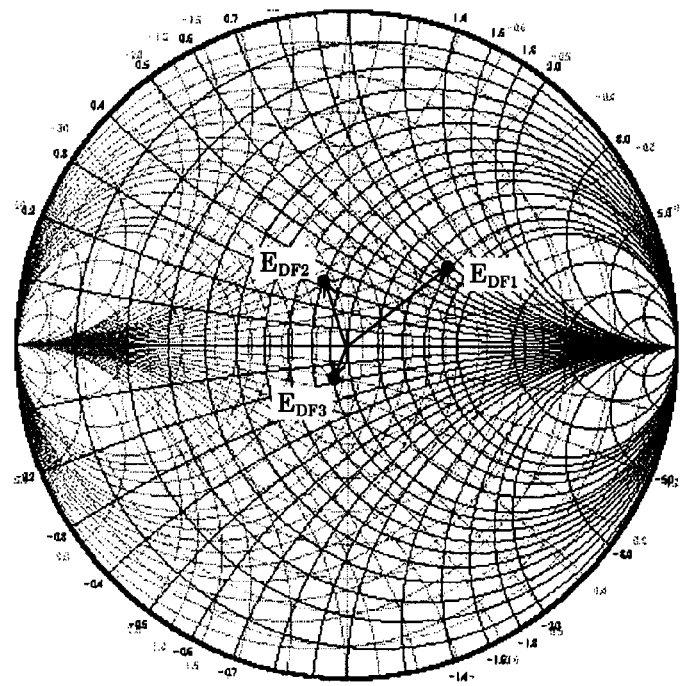
FIG. 4 is a Smith chart that illustrates three specified directional errors.

In the foregoing description, an example of determination of the reflection coefficient $(\Gamma_{Tx}, \Gamma_{Ty})$ of a DUT using equations is described. Next, description using a Smith chart is provided. FIG. 4 illustrates the specified relation values ($E_{DF1}$, $E_{DF2}$, and $E_{DF3}$) of the three directional errors 7a to 7c. As illustrated, three vectors ($E_{DF1}$, $E_{DF2}$, and $E_{DF3}$) may preferably be separated from each other to no less than a measurement error of the electric-power measuring instrument 6. Here, because a reflection-free termination is connected to a DUT side when specification is performed, they are expressed in three vectors such that a point at the center is 50 Ω. When an element other than the reflection-free termination is connected, the point at the center is not 50 Ω. In either case, the three directional errors are quantified.

Figure 5:
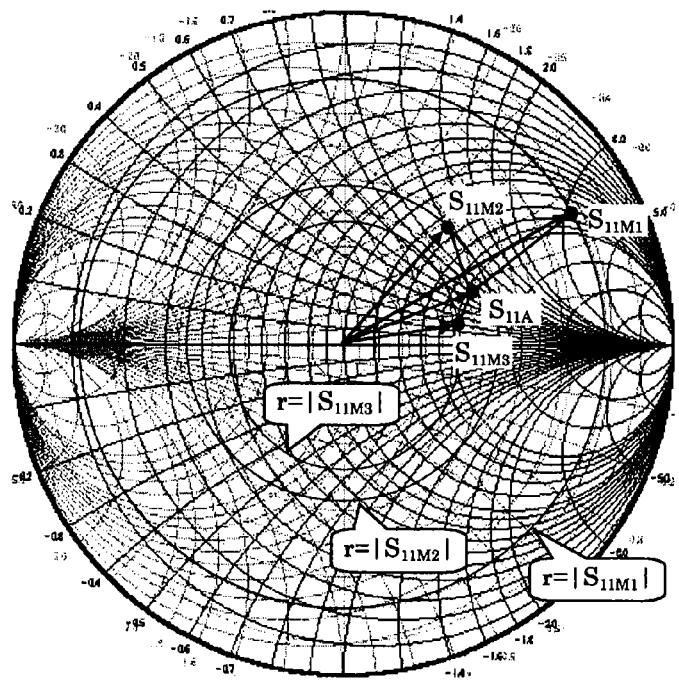
FIG. 5 is a Smith chart with scalar measured values of superimposed signals of a wave reflected from a DUT and a wave reflected from directional errors.

FIG. 5 illustrates measured values (scalar values) measured by the electric-power measuring instrument 5 when the directional selector switch 6 is switched to each of the three positions. The measured values are represented by three concentric circles having their radii of the magnitudes thereof ($r = |S_{11M1}|$, $r = |S_{11M2}|$, $r = |S_{11M3}|$). Here, a combination of vectors ($S_{11M1}$, $S_{11M2}$, $S_{11M3}$) satisfying the scalar values obtained in FIG. 5 while satisfying the directional error vectors ($E_{DF1}$, $E_{DF2}$, and $E_{DF3}$) determined in FIG. 4 is determined. That is, a combination of vectors whose vertexes form a first triangle congruent to a second triangle formed by joining the vertexes of the directional error vectors determined in FIG. 4, the vertexes of the vectors forming the first triangle lying on three concentric circles, is determined. The vector $S_{11A}$ for matching the triangle illustrated in FIG. 4 with the triangle illustrated in FIG. 5 is a reflection coefficient of the DUT.

Second Preferred Embodiment

Figure 6:
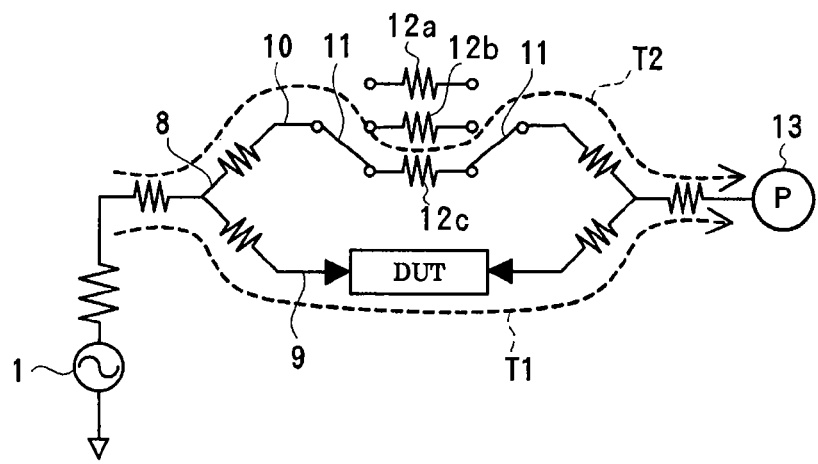
FIG. 6 is a schematic circuit diagram for measuring a transmission coefficient according to a second embodiment of the present invention.

FIG. 6 illustrates an apparatus for measuring a transmission coefficient of a DUT according to a second preferred embodiment of the present invention. Measurement signals generated by a signal source 1 are separated into a first measurement signal for a measurement signal path 9 and a second measurement signal for an error signal path 10 by a power splitter 8. The first measurement signal entering the measurement signal path 9 is applied to the DUT. The second measurement signal entering the error signal path 10 is applied to one of three leakage errors 12a to 12c via a leakage selector switch 11. A wave transmitted through the DUT and a wave transmitted through each of the leakage errors 12a to 12c are superimposed, and superimposed signals are each measured as an electric-power value (scalar value) by an electric-power measuring instrument 13. The leakage errors 12a to 12c have different phases of transmitted waves from each other, and relation values (relative vector values) of the leakage errors are determined in advance.

A process for measuring a transmission coefficient of a DUT will now be described.

—Specifying Leakage Errors—

Relation values ($E_{XF1}$, $E_{XF2}$, and $E_{XF3}$) of the three leakage errors 12a to 12c described above can be determined by, for example, actual measurement using a calibrated VNA. Alternatively, the relation values of the three leakage errors in three different kinds of states can be determined by carrying out an original calibration procedure described below without measurement using the VNA. For example, in the case of determination of the relation values of the three leakage errors using a two-port VNA, a port 1 of the VNA is connected to a signal source side illustrated in FIG. 6, and a port 2 of the VNA is connected to an electric-power measuring instrument side. Three measured values $S_{21}$ of a transmission coefficient measured when the leakage selector switch 11 is switched to each of the three positions are the relation values of the three leakage errors. Measurement terminals connected to the DUT may be in an open state, or each of them may be connected to a reflection-free termination. Once the relation values of the three leakage errors have been specified in this way in the production of the measuring apparatus, the specified values can be used continuously thereafter.

—Scalar Measurement—

After the completion of specification of the leakage errors 12a to 12c, the measuring apparatus illustrated in FIG. 6 is connected to a DUT, and measurement is performed. More specifically, electric-power values (scalar values) of a transmitted wave in three states selected by the leakage selector switch 11 are measured by the electric-power measuring instrument 13. The measured values are the amplitudes of superimposed signals of a transmitted wave T1 transmitted through the DUT and transmitted waves T2 transmitted through the leakage errors 12a to 12c.

—Conversion from Scalar Values to Vector Value—

Conversion into a transmission coefficient $T_T$ of the DUT is performed using the previously specified vector values of the three leakage errors and three electric-power values measured by the scalar measurement described above. When the real part and the imaginary part of the transmission coefficient $T_T$ are expressed as $T_{Tx}$ and $T_{Ty}$ by adding the suffixes x and y to $T_T$, respectively, the conversion expressions are represented by the following equations:

$$T_{Tx} = \{E_{XF1y}*(|T_{m2}|^2 - |T_{m3}|^2 + E_{XF3x}^2 + E_{XF3y}^2 - E_{XF2x}^2 - E_{XF2y}^2) + E_{XF2y}*(|T_{m3}|^2 - |T_{m1}|^2 + E_{XF1x}^2 + E_{XF1y}^2 - E_{XF3x}^2 - E_{XF3y}^2) + E_{XF3y}*(|T_{m1}|^2 - |T_{m2}|^2 + E_{XF2x}^2 + E_{XF2y}^2 - E_{XF1x}^2 - E_{XF1y}^2)\}/\{2*(E_{XF1x}E_{XF3y} + E_{XF2x}E_{XF1y} + E_{XF3x}E_{XF2y} - E_{XF1x}E_{XF2y} - E_{XF2x}E_{XF3y} - E_{XF3x}E_{XF1y})\} \quad \text{(Eq. 10)}$$

$$T_{Ty} = \{|T_{m1}|^2 - |T_{m2}|^2 + E_{XF2x}^2 + E_{XF2y}^2 - E_{XF1x}^2 - E_{XF1y}^2 - 2T_{Tx}*(E_{XF1x} - E_{XF2x})\}/\{2*(E_{XF1y} - E_{XF2y})\} \quad \text{(Eq. 11)}$$

where $|T_{m1}|$, $|T_{m2}|$, and $|T_{m3}|$ are measured values (electric-power values) measured when the leakage selector switch 11 is switched to each of the three positions and $(E_{XF1x}, E_{XF1y})$, $(E_{XF2x}, E_{XF2y})$, and $(E_{XF3x}, E_{XF3y})$ represent the real parts and the imaginary parts of the relation values $(E_{XF1}, E_{XF2},$ and $E_{XF3})$ of the three leakage errors 12a to 12c, respectively, such that the suffix x is added to the real parts and the suffix y is added to the imaginary parts.

From the calculation described above, one vector measured value can be obtained from three scalar measured values. The obtained value is equal to a vector measured value detected by a VNA typically using a mixer. An error of the measurement system contained in a vector measured value of a DUT derived in the above-described way can be removed by carrying out a typical calibration procedure performed by a VNA because the vector measured value has been obtained. For example, by performing SOL calibration (a calibration scheme using short-open-load calibration standards), the error resulting from the measurement system can be removed from the measured value, thus obtaining a true value of the DUT.

Third Preferred Embodiment

Figure 7:
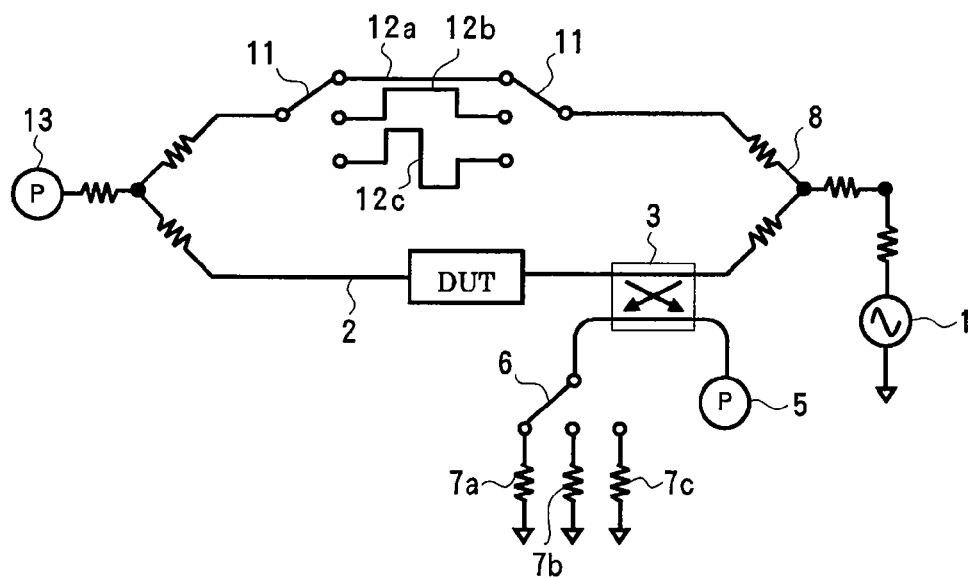
FIG. 7 is a schematic circuit diagram that illustrates an example of a one-path two-port measurement system in which a reflection measurement system and a transmission measurement system are combined according to a third embodiment of the present invention.

FIG. 7 illustrates an example of a one-path two-port measurement system in which the reflection coefficient measurement system illustrated in FIG. 1 and the transmission coefficient measurement system illustrated in FIG. 6 are combined. Measurement signals are separated by a power splitter 8. A first measurement signal is applied to a DUT, and a second measurement signal is applied to one of three leakage errors 12a to 12c via a leakage selector switch 11. A superimposed signal of a wave transmitted through the DUT and a wave transmitted through each of the leakage errors 12a to 12c is measured as an electric-power value (scalar value) by an electric-power measuring instrument 13. A coupler 3 is disposed in a measurement signal path 2. A first port of a signal path coupled to the measurement signal path 2 by the coupler 3, the first port being adjacent to the signal source, is connected to an electric-power measuring instrument 5 measuring a reflected wave as an electric-power value. A second port of the signal path being adjacent to the DUT is connected to three directional errors 7a to 7c via a directional selector switch 6. An electric-power value is measured by the electric-power measuring instrument 5 while the directional selector switch 6 is switched to each of the three positions. An electric-power value is measured by the electric-power measuring instrument 13 while the leakage selector switch 11 is switched to each of the three positions. From the measured values, a reflection coefficient $\Gamma_T$ and a transmission coefficient $T_T$ of the DUT can be determined using Equations 8 and 9 and Equations 10 and 11.

Fourth Preferred Embodiment

Figure 8:
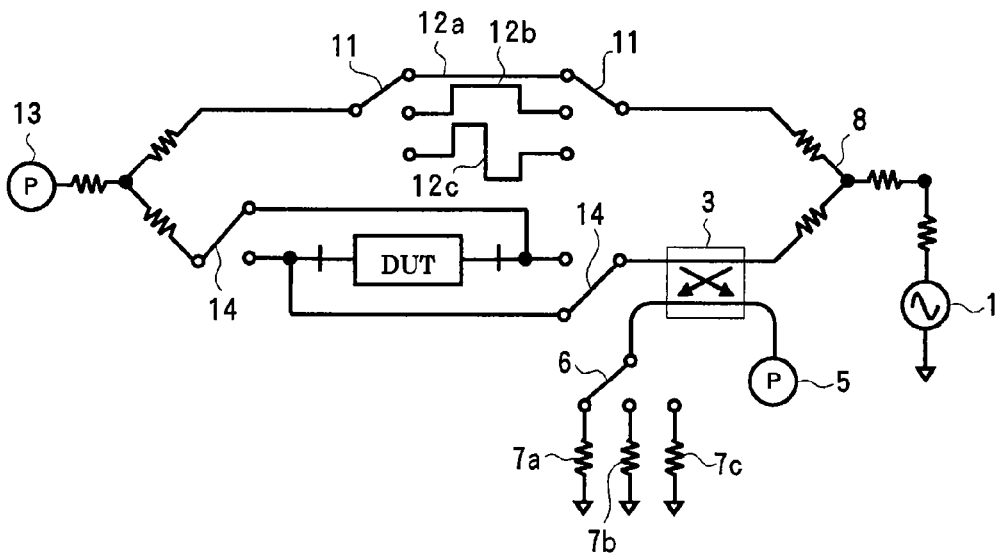
FIG. 8 is a schematic circuit diagram that illustrates an example of a full two-port measurement system in which a reflection measurement system and a transmission measurement system are combined according to a fourth embodiment of the present invention.

FIG. 8 illustrates an example of a full two-port measurement system in which the reflection coefficient measurement system illustrated in FIG. 1 and the transmission coefficient measurement system illustrated in FIG. 6 are combined. In this full two-port measurement system, except that a selector switch 14 is disposed in each of signal paths connected to both ends of a DUT and that the direction in the DUT can be changed by use of the selector switches 14, structures are substantially the same as those in FIG. 7. Thus, the same reference numerals are used, and the redundant description is avoided. With this embodiment, measurement can be performed while the direction in the DUT is changed by switching of the selector switch 14, thus enabling full two-port measurement.

—Experimental Example—

An experimental example of the present invention for reflection measurement will now be described. Here, by use of only amplitude information of a measured value measured by a VNA used as a scalar measuring instrument, a scalar measured value is obtained. In an actual measurement system, an inexpensive power meter or power sensor is ordinarily used as the scalar measuring instrument. However, in this experimental example, the same measuring instrument is used to prove characteristics of the present invention in which a vector measured value can be obtained from only amplitude information. That is, the same measuring instrument is used, which means that there are no variations caused by differences between instruments. If the present invention is effective, a measured value identical with a measured value measured by a VNA should be obtainable from only amplitude information. Thus, this is aimed at proving the effectiveness of the present invention.

The experimental conditions are shown below. The measured value compared with a measured value obtained using the present invention is a measured value measured by a calibrated VNA.

DUT: A surface-mount device connected to a CPW transmission line connected to a coaxial connector Vector measurement instrument: E8364B (Agilent Technologies)

Scalar measuring instrument: E8364B (Agilent Technologies)

(Only amplitude information of a measured value)

Frequency range: 34 GHz-42 GHz

Number of data: 801

IF bandwidth: 100 Hz (No averaging)

Coupler: Ka band (26.5 GHz-40 GHz) Waveguide 10 dB coupler

Directional error: three offset shorts ($\lambda g=0$, $\frac{1}{6}$, $\frac{1}{3}$ at 38 GHz)

Figure 9:
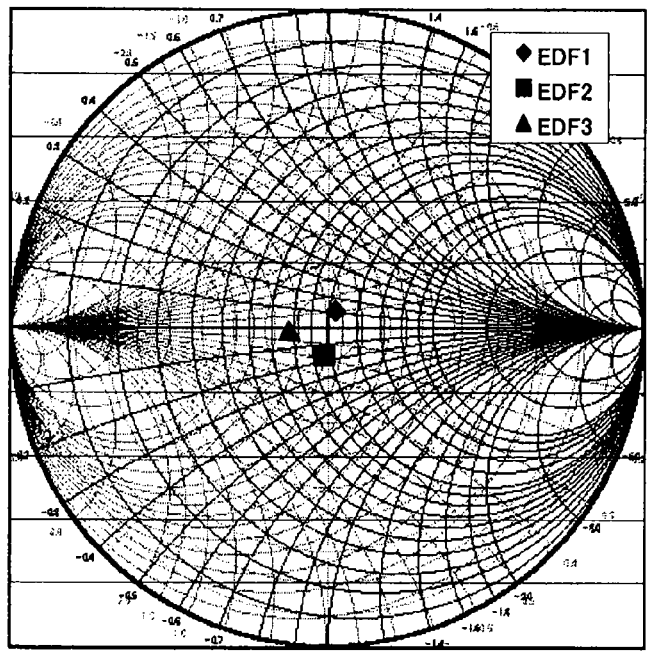
FIG. 9 is a Smith chart that illustrates relation values of three directional errors measured by a vector measuring instrument.
Figure 10:
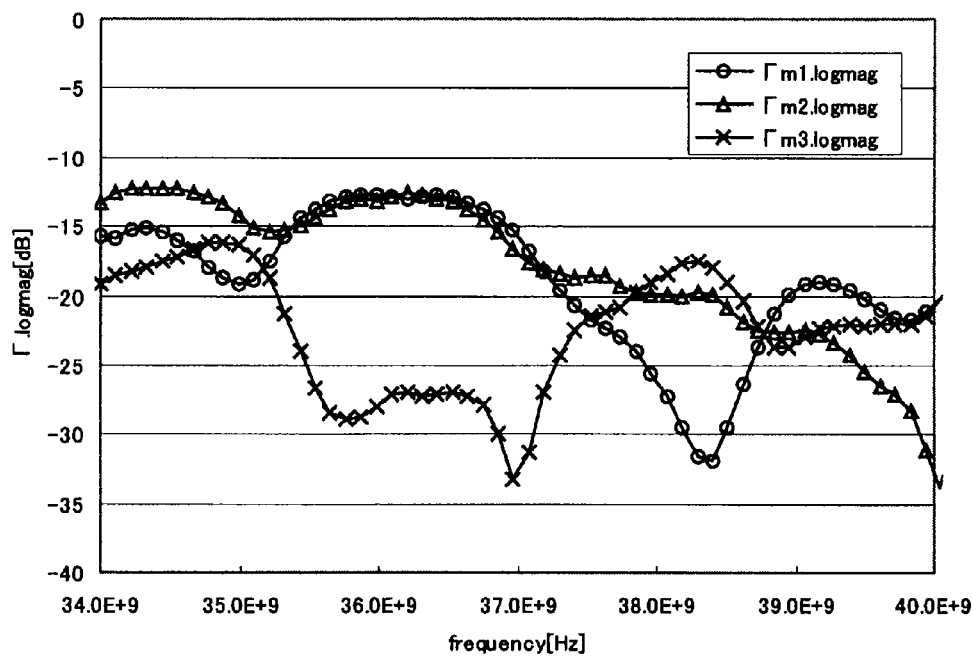
FIG. 10 illustrates scalar measured values of a DUT for three cases having different directional errors.
Figure 11:
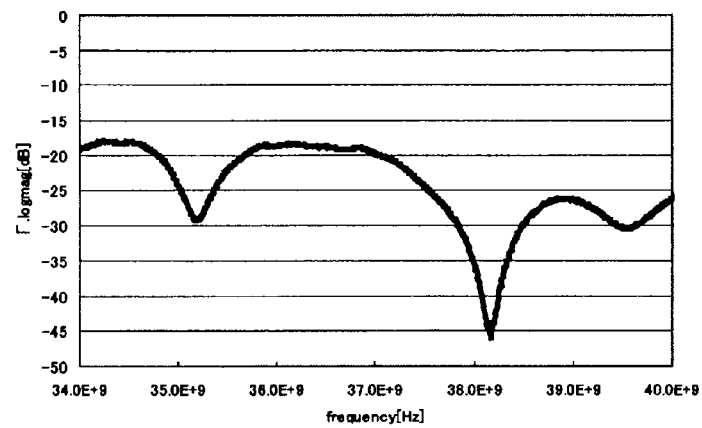
FIG. 11 is a graph of vector measured values (amplitudes) of a DUT calculated using a process according to the present invention.
Figure 12:
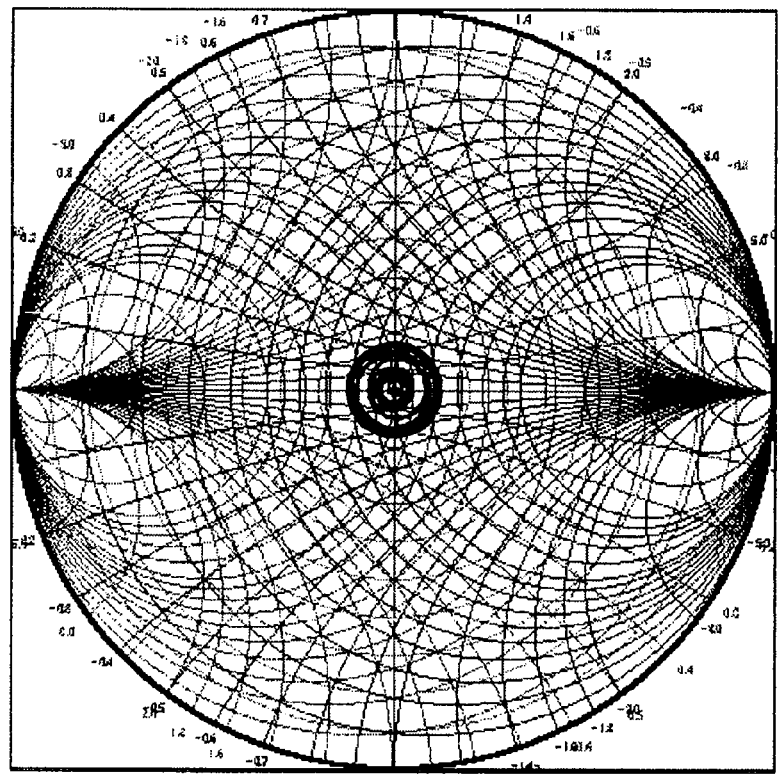
FIG. 12 is a Smith chart that illustrates the vector measured values of the DUT calculated using the process according to the present invention.

FIG. 9 illustrates relation values ($E_{DF1}, E_{DF2},$ and $E_{DF3}$) of three directional errors at 38 GHz measured by the vector measuring instrument. FIG. 10 illustrates scalar measured values of the DUT in three cases of different directional errors. FIGS. 11 and 12 show measured values (amplitudes) of the DUT after calculation of substituting the measured values in FIGS. 9 and 10 into Equations 8 and 9 and vector measured values, respectively. FIG. 12 shows that vector measured values containing phase information have been obtained from three scalar measured values.

Figure 13:
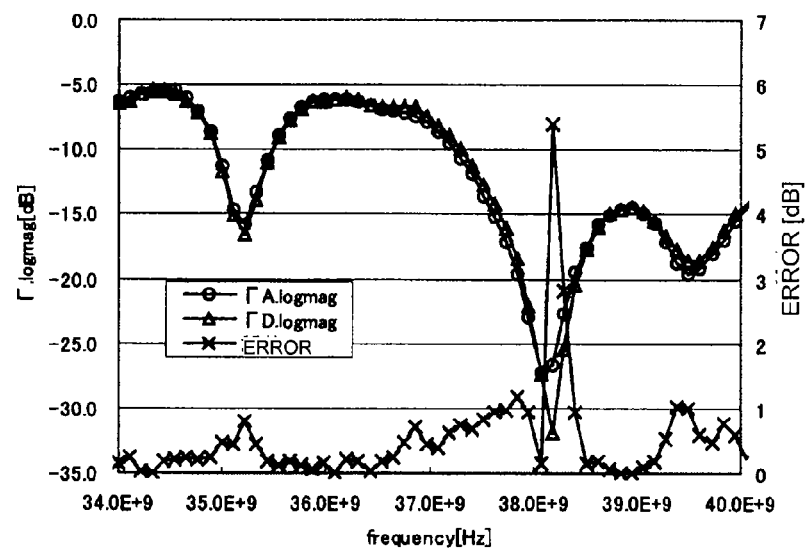
FIG. 13 is a graph that shows comparison between measured values of a DUT using a process according to the present invention, $\Gamma_D$, and measured values of the DUT using a calibrated VNA, $\Gamma_A$.
Figure 14:
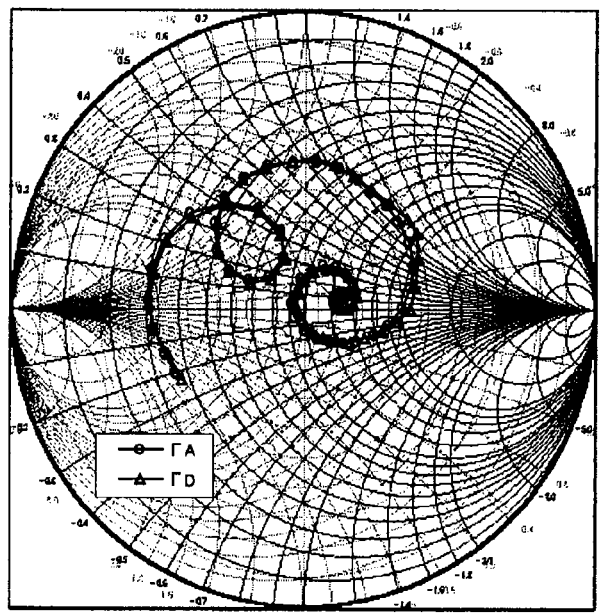
FIG. 14 is a Smith chart that shows comparison between the measured values of the DUT using the process according to the present invention, $\Gamma_D$, and the measured values of the DUT using a calibrated VNA, $\Gamma_A$.

The measured values illustrated in FIGS. 11 and 12 contain errors of the measurement system. Therefore, a standard was measured using the measurement system of the present invention in a similar manner in order to correct vector errors, the measured values in FIGS. 11 and 12, were corrected, and a vector measured value $\Gamma_D$ of the DUT was calculated. Comparisons between the measured value $\Gamma_D$ of the DUT obtained by the process of the present invention and the measured value $\Gamma_A$ obtained using a calibrated VNA are shown in graph form in FIGS. 13 and 14. As is apparent from FIGS. 13 and 14, the measured values in both of the figures are substantially the same, and it finds that the present invention is an accurate vector measurement method.

Fifth Preferred Embodiment

—Process for Determining Relation Values of Three Directional Errors Using Scalar Measuring Instrument—

A process for determining relation values of three directional errors using a scalar measuring instrument without using a VNA will now be described. First, each of two kinds of DUTs (m and n) having different reflection coefficients is connected to the measuring apparatus illustrated in FIG. 1, and is measured in three states corresponding to the three directional errors. In this procedure, knowing the relationship among the three directional errors is sufficient, and phases and absolute positions do not matter. Thus, for the sake of simplicity, it is assumed that the measured value of a first DUT (m) in a first directional-error state has a phase of 0°. The position on the complex plane at this time is like $\Gamma_{m1}$ illustrated in FIG. 15. The measured values in second and third directional-error states on the complex plane are, for example, like $\Gamma_{m2}$ and $\Gamma_{m3}$ illustrated in FIG. 15. Here, because the observed values are scalar values, the real positions of those points are unknown, and it is only known that those points should lie on the circumferences of circles having their centers at the origin point and radii $|\Gamma_{m2}|$ and $|\Gamma_{m3}|$. Thus, it is assumed that the angle between $\Gamma_{m1}$ and each of those points is $\theta_1$ and $\theta_2$. As a matter of course, $\theta_1$ and $\theta_2$ are unknown quantities at this point in time.

Figure 15:
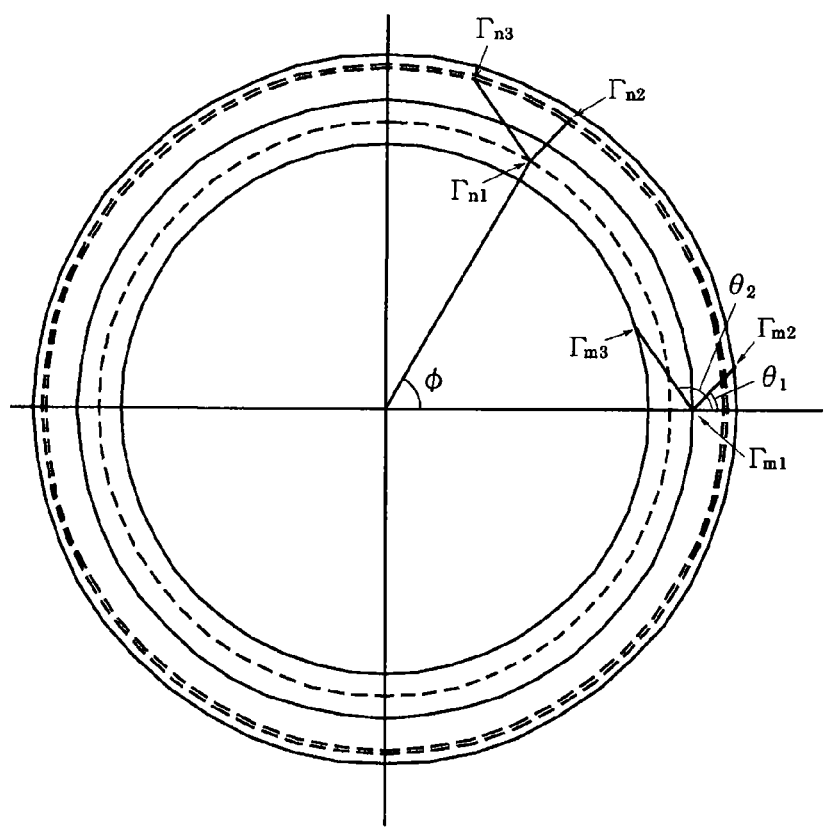
FIG. 15 is an illustration for describing a process for determining relation values of three directional errors using a scalar measuring instrument on the complex plane according to a fifth embodiment.

Then, assuming that the phase of a measured value $\Gamma_{n1}$ of a second DUT (n) in a first directional-error state is shifted by $\phi$ from $\Gamma_{m1}$, the situation is shown in FIG. 15. In addition, the angle between $\Gamma_{n1}$ and each of $\Gamma_{n2}$ and $\Gamma_{n3}$ should be $\theta_1$ and $\theta_2$ because the relationship among the directional errors is the same as in the previous case, and because they should lie on the circumferences of circles having their centers at the origin point and radii $|\Gamma_{n2}|$ and $|\Gamma_{n3}|$ (indicated by dashed lines), the points are determined as illustrated in the drawing.

If $\theta_1$, $\theta_2$, and $\phi$ are appropriately selected, as long as the directional errors are constant regardless of DUT, a triangle defined by $\Gamma_{m1}$ to $\Gamma_{m3}$ and a triangle defined by $\Gamma_{n1}$ to $\Gamma_{n3}$ are congruent to each other. Therefore, by selection of $\theta_1$, $\theta_2$, and $\phi$ such that the triangles becomes congruent to each other (in reality, they becomes congruent as much as possible because there are influences of measurement errors or other causes), the relation values of the three directional errors can be determined.

More specific description is provided below.

A straight line that passes through $(x_0, y_0)$ and has a slope $\theta$ is given by the following expression:

$$\sin\theta(x-x_0)-\cos\theta(y-y_0)=0$$

A circle that has the center at the origin point and the radius r is given by the following expression:

$$x^2+y^2=r^2$$

The intersection (x, y) of the straight line and the circle is represented below.

$$x=x_0\sin^2\theta-y_0\cos\theta\sin\theta\pm\cos\theta\sqrt{\{r^2-(x_0\sin\theta-y_0\cos\theta)^2\}}$$

$$y=y_0\cos^2\theta-x_0\cos\theta\sin\theta\pm\sin\theta\sqrt{\{r^2-(x_0\sin\theta-y_0\cos\theta)^2\}}$$

First, it is assumed that $\theta_1$, $\theta_2$, and $\phi$ have any specific values.

The coordinates of $\Gamma_{m1}$ can be given by $(|\Gamma_{m1}|, 0)$.

The coordinates of $\Gamma_{m2}$ can be determined when $(x_0, y_0)$ are the coordinates of $\Gamma_{m1}$, the radius r is $|\Gamma_{m2}|$, and the slope $\theta$ is $\theta_1$.

The coordinates of $\Gamma_{m3}$ can be determined in the same manner as $\Gamma_{m2}$.

The coordinates of $\Gamma_{n1}$ can be given by $(|\Gamma_{n1}|\cos\phi, |\Gamma_{n1}|\sin\phi)$.

The coordinates of $\Gamma_{n2}$ can be determined in the same manner as $\Gamma_{m2}$.

The coordinates of $\Gamma_{n3}$ can be determined in the same manner as $\Gamma_{m3}$.

From the obtained coordinates, an estimated error E can be determined by the following expression:

$$E=|\Gamma_{n1}-\Gamma_{m1}|^2+|\Gamma_{n2}-\Gamma_{m2}|^2$$

By changing $\theta_1$, $\theta_2$, and $\phi$ using an appropriate algorithm, values of $\theta_1$, $\theta_2$, and $\phi$ at which the value E is minimum are determined. Therefore, $\Gamma_{m1}$, $\Gamma_{m2}$, $\Gamma_{m3}$ corresponding to the values $\theta_1$, $\theta_2$, and $\phi$ obtained in this way can be determined as the relation values of the three directional errors. It is necessary to perform typical one-port calibration after the relation values of the three directional errors are obtained.

As described above, the relation values of the three directional errors are obtainable using only a scalar measuring instrument without use of a VNA. Accordingly, even if the status of the measuring apparatus is changed for some reason, appropriate relation values of the three directional errors can be obtained again without use of a VNA. That is, because a measuring apparatus according to the present invention can be calibrated in a mass production process itself in which the measuring apparatus is used, recovery in the event of an emergency is facilitated. In addition, because a VNA is not required, as described above, vector measurement can be performed when the measurement apparatus does not have a VNA. Moreover, there is an advantage in which vector measurement in a high-frequency range that is not supported by a VNA can be performed.

Sixth Preferred Embodiment

Figure 16:
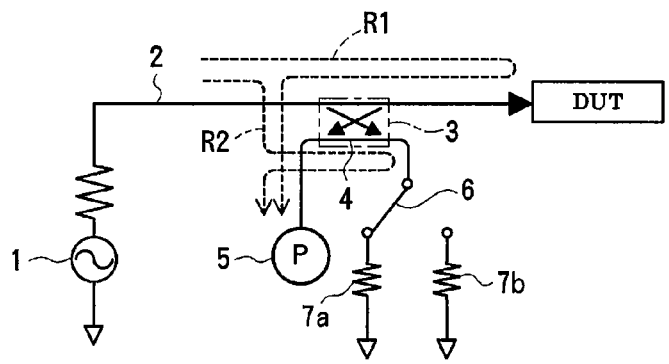
FIG. 16 is a schematic circuit diagram for measuring a reflection coefficient according to a sixth embodiment of the present invention.

FIG. 16 illustrates a reflection measurement system for use when the number of vector signals to be superimposed is two. In FIG. 16, the same reference numerals are used as in FIG. 1 for the same parts, and redundant description is avoided.

In the case of the present embodiment, because there are only two directional error components for use in superposed signals, basically, two vector values are derived, so a vector value of a reflection signal of a DUT cannot be uniquely determined. However, in screening in mass production, such a vector value of a reflection signal of a DUT can be determined by selection of one of the two values by estimation based on characteristics of the DUT at the design and development stages.

For the reflection measurement system illustrated in FIG. 16, two electric-power values ($|\Gamma_{m1}|$ and $|\Gamma_{n1}|$) of the DUT measured by a scalar measuring instrument when two directional errors $E_{DF1}$ and $E_{DF2}$ are switched are the same as values represented by Equations 3 and 4. As vector values of a reflection signal of the DUT in which the directional errors are removed from these electric-power values, two vector measured values $(x_1, y_1)$ and $(x_2, y_2)$ are derived, as shown in Equations 12 to 14.

$$\begin{pmatrix} x_1 \\ y_1 \end{pmatrix} = \begin{pmatrix} (E_{DF1y} - E_{DF2y})A - \\ \dfrac{\left[ \begin{array}{l} |\Gamma_{m2}|^2 (E_{DF1x} - E_{DF2x}) + \\ |\Gamma_{m1}|^2 (E_{DF2x} - E_{DF1x})(E_{DF1x} - E_{DF2x}) \left\{ \begin{array}{l} (E_{DF1x} - E_{DF2x})^2 + \\ (E_{DF1y} - E_{DF2y})^2 \end{array} \right\} \end{array} \right]}{2\{(E_{DF1x} - E_{DF2x})^2 + (E_{DF1x} - E_{DF2x})^2\}} \\ -(E_{DF1x} - E_{DF2x})A - \\ \dfrac{\left[ \begin{array}{l} |\Gamma_{m1}|^2 (E_{DF1y} - E_{DF2y}) + \\ |\Gamma_{m2}|^2 (E_{DF2y} - E_{DF1y})(E_{DF1y} - E_{DF2y}) \left\{ \begin{array}{l} (E_{DF1x} - E_{DF2x})^2 + \\ (E_{DF1y} - E_{DF2y})^2 \end{array} \right\} \end{array} \right]}{2\{(E_{DF1x} - E_{DF2x})^2 + (E_{DF1y} - E_{DF2y})^2\}} \end{pmatrix} \quad \text{(Eq. 12)}$$

$$\begin{pmatrix} x_2 \\ y_2 \end{pmatrix} = \begin{pmatrix} -(E_{DF1y} - E_{DF2y})A - \\ \dfrac{\left[ \begin{array}{l} |\Gamma_{m2}|^2 (E_{DF1x} - E_{DF2x}) + \\ |\Gamma_{m1}|^2 (E_{DF2x} - E_{DF1x})(E_{DF1x} - E_{DF2x}) \left\{ \begin{array}{l} (E_{DF1x} - E_{DF2x})^2 + \\ (E_{DF1y} - E_{DF2y})^2 \end{array} \right\} \end{array} \right]}{2\{(E_{DF1x} - E_{DF2x})^2 + (E_{DF1x} - E_{DF2x})^2\}} \\ (E_{DF1x} - E_{DF2x})A - \\ \dfrac{\left[ \begin{array}{l} |\Gamma_{m1}|^2 (E_{DF1y} - E_{DF2y}) + \\ |\Gamma_{m2}|^2 (E_{DF2y} - E_{DF1y})(E_{DF1y} - E_{DF2y}) \left\{ \begin{array}{l} (E_{DF1x} - E_{DF2x})^2 + \\ (E_{DF1y} - E_{DF2y})^2 \end{array} \right\} \end{array} \right]}{2\{(E_{DF1x} - E_{DF2x})^2 + (E_{DF1y} - E_{DF2y})^2\}} \end{pmatrix} \quad \text{(Eq. 13)}$$

$$A = \sqrt{\dfrac{-\{(E_{DF1x} - E_{DF2})^2 + (E_{DF1y} - E_{DF2y})^2 - (\Gamma_{m1} - \Gamma_{m2})^2\}}{\{(E_{DF1x} - E_{DF2x})^2 + (E_{DF1y} - E_{DF2y})^2 - (\Gamma_{m1} + \Gamma_{m2})^2\}}} \quad \text{(Eq. 14)}$$

Figure 17:
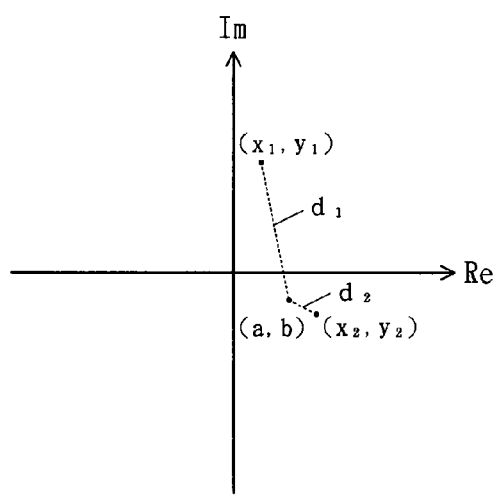
FIG. 17 is a Smith chart in which two derived vector measured values of a DUT and known characteristics are plotted according to the sixth embodiment.

In this case, at frequency points, as illustrated in FIG. 17, two vector measured values $(x_1, y_1)$ and $(x_2, y_2)$ are plotted on a Smith chart. In mass production, as a rule, DUTs having substantially the same characteristics are measured. At this time, if characteristics of DUTs are known (they may be simulated values), even with the measurement system in this embodiment, the characteristics of a DUT can be estimated by selection of a vector value that is closer to the known characteristics of the same kind of the DUT from two vector values of the DUT.

A process for selecting a vector value will now be described below.

In FIG. 17, known characteristics (a, b), whose values are obtained by some method, of a DUT having substantially the same characteristics as those in a DUT subjected to measurement are plotted. In this example, apparently, $(x_2, y_2)$ is closer to the known characteristics (a, b), so it can be estimated that the value $(x_2, y_2)$ is appropriate. In reality, preferably, the following comparison process may be performed. That is, the distance $d_1$ between (a, b) and $(x_1, y_1)$ and the distance $d_2$ between (a, b) and $(x_2, y_2)$ are represented by the following expressions.

$$d_1 = \sqrt{(x_1-a)^2 + (y_1-b)^2} \quad \text{(Eq. 15)}$$

$$d_2 = \sqrt{(x_2-a)^2 + (y_2-b)^2} \quad \text{(Eq. 16)}$$

When the values $d_1$ and $d_2$ are compared, it can be estimated that a smaller vector value, i.e., a value that is closer to (a, b) is the appropriate measured value.

The results of an experiment that actually performed derivation of vector values using Equations 12 to 14 will be shown next. The experimental conditions are provided below. Two offset shorts were used as directional errors.

DUT sample: A surface-mount device connected to a CPW transmission line connected to a coaxial connector
Vector measurement instrument: E8364B (Agilent Technologies)
Scalar measuring instrument: E8364B (Agilent Technologies)
(Only amplitude information of a measured value)
Frequency range: 34 GHz-42 GHz
Number of data: 801
IF bandwidth: 100 Hz (No averaging)
Coupler: Ka band (26.5 GHz-40 GHz) Waveguide 10 dB coupler
Directional error: two offset shorts ($\lambda g=0$, ⅙ at 38 GHz)

Figure 18:
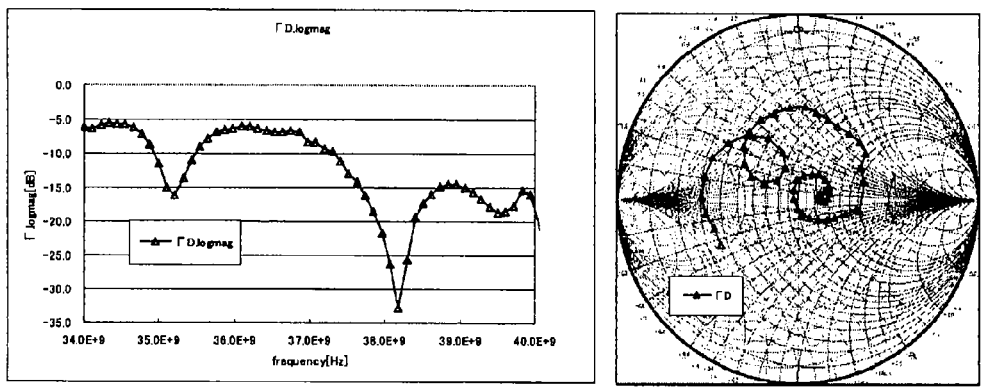
FIG. 18 illustrates amplitudes of the DUT determined from a first measured value of the two values according to the sixth embodiment and a Smith chart thereof.
Figure 19:
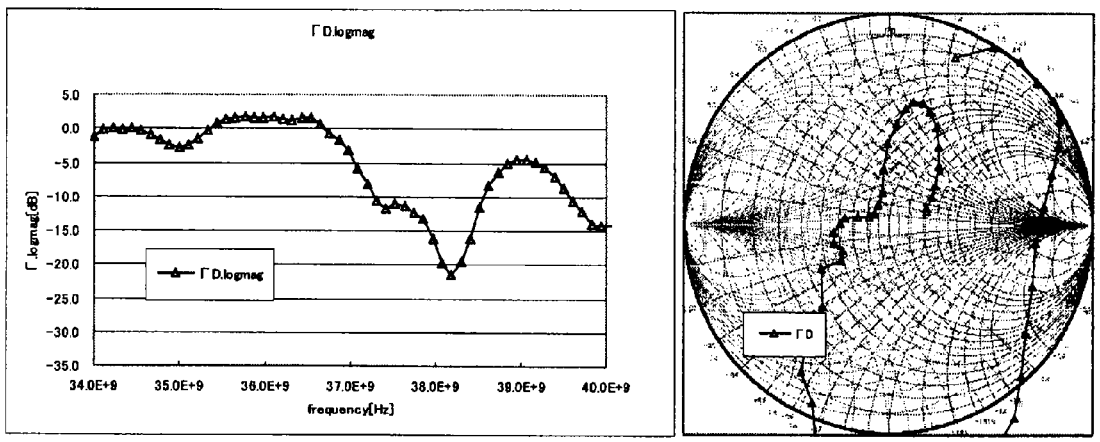
FIG. 19 illustrates amplitudes of the DUT determined from a second measured value of the two values according to the sixth embodiment and a Smith chart thereof.
Figure 20:
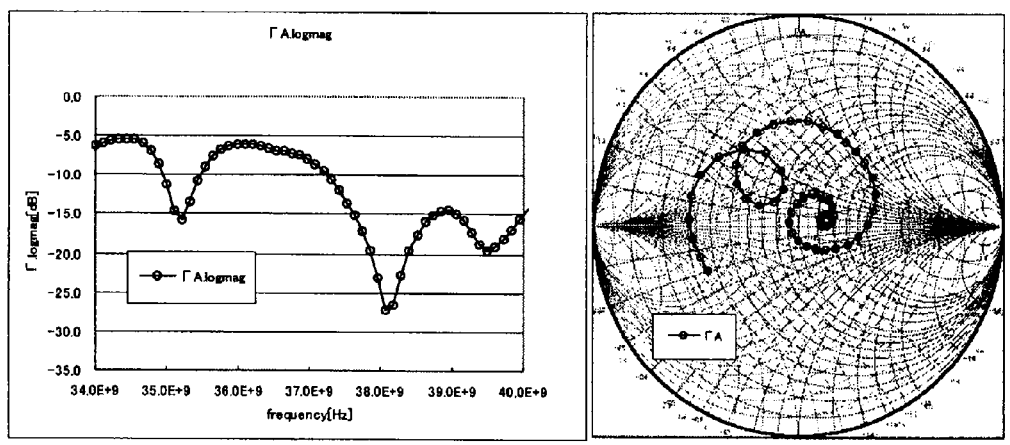
FIG. 20 illustrates known amplitudes of a DUT to select a true value according to the sixth embodiment a graph and a Smith chart thereof.

The results of a derivation of the amplitudes and the vector values of the DUT sample using Equations 12 and 14 and those using Equations 13 and 14 are shown in FIGS. 18 and 19, respectively. FIG. 20 illustrates predetermined known characteristics of a device sample of the same kind. When values that are closer to the values in FIG. 20 are selected from those in FIGS. 18 and 19, it can be estimated that the selected values are vector values of the DUT sample subjected to measurement. In this example, the values in FIG. 18, i.e., values derived using Equations 12 and 14, are all closer to the values in FIG. 20. Therefore, it can be estimated that FIG. 18 shows the amplitudes and vector values of the DUT sample.

In the foregoing description, an example in which a reflection coefficient of a DUT is measured through switching between two directional errors is described. A transmission coefficient of a DUT can be measured through switching between two leakage errors. In such a case, for example, two of the leakage errors 12*a* to 12*c* illustrated in FIG. 6 may be used.

When a reflected wave and a transmitted wave are measured by use of a known VNA structure, a considerable increase in the price of a measurement system is caused and the difficulty in high-precision measurement is enhanced by an increase in frequency. In contrast, according to the present invention, vector measurement can be performed by use of an electric-power measurement that is an inexpensive basic measurement virtually independent of frequency. That is, because vector measurement of a reflected wave and a transmitted wave can be performed by only use of three scalar measured values, even when the frequency is increased, as long as electric-power measurement is possible, an advantage is obtainable in which vector error correction that achieves high-precision measurement while suppressing an increase in the price of a measuring instrument can be performed. As a result, in a high-frequency product operable in the extremely high frequency band and above, the cost required in a step of screening characteristics being increased by the expensiveness of a known VNA, by replacement with a high-precision and inexpensive measuring instrument, a significant reduction in cost relating to the vector measurement can be expected. In the high-frequency product operable in the extremely high frequency band and above, such a product being often produced by small-lot production of a wide variety of products, with an inexpensive measuring instrument according to the present invention, the measuring instrument can be prepared for each product. Therefore, the burden on a step, such as a changeover, can be reduced. The characteristics described above provide a measurement step in a high frequency range at or above the extremely high frequency band, which requires fine adjustment of a measurement system, with a considerable advantage of ensuring the accuracy and reliability in measurement of products.

The invention claimed is:

1. A measuring method for vector-measuring a scattering coefficient of a device under test, the measuring method comprising:
    applying a signal to the device under test;
    measuring a reflected wave reflected from the device under test or a transmitted wave transmitted through the device under test;
    superimposing at least three different vector signals on the reflected wave or the transmitted wave of the device under test to obtain at least three superimposed signals;
    specifying a relation value of each of the at least three vector signals as a vector value;
    measuring each of the at least three superimposed signals as at least three scalar values;
    converting the at least three scalar values into at least one vector value using the relation values obtained in the step of specifying the relation value of each of the at least three vector signals; and
    determining a scattering coefficient of the device under test.

2. The measuring method according to claim 1, further comprising:
    generating at least three directional error vector signals; and
    selecting at least one of the at least three directional error vector signals to be superimposed on the reflected wave of the device under test,
    wherein the converted vector value is a reflection coefficient.

3. The measuring method according to claim 1, further comprising:
    generating at least three leakage error vector signals; and
    selecting at least one of the at least three leakage error vector signals to be superimposed on the transmitted wave of the device under test,
    wherein the converted vector value is a transmission coefficient.

4. The measuring method according to claim 1, wherein the at least three vector signals are separated from each other to no less than a measurement accuracy of a scalar measuring instrument.

5. A measuring apparatus for vector-measuring a scattering coefficient of a device under test, the measuring apparatus comprising:
    a signal source that applies a signal to the device under test;
    a superimposing signal system that superimposes at least three different vector signals whose relation values are each specified as a vector value on one of a reflected wave reflected from the device under test and a transmitted wave transmitted through the device under test;
    a scalar measuring instrument that measures each of the superimposed signals as a scalar value; and
    a converter that converts the at least three scalar values measured by the scalar measuring instrument into at least one vector value using the specified relation values of the at least three vector signals and determines a scattering coefficient of the device under test.

6. The measuring apparatus according to claim 5, wherein the superimposing signal system includes:
    at least three directional errors that generate at least three directional error vector signals; and
    a directional error selector that selects at least one of the at least three directional errors to be superimposed on the reflected wave of the device under test,
    wherein the vector value converted by the converter is a reflection coefficient.

7. The measuring apparatus according to claim 5, wherein the superimposing signal system includes:
    at least three leakage errors that generate at least three leakage error vector signals; and
    a leakage error selector that selects at least one of the at least three leakage errors to be superimposed on the transmitted wave of the device under test,
    wherein the vector value converted by the converter is a transmission coefficient.

8. The measuring apparatus according to claim 5, wherein the superimposing signal system includes:
    at least three directional errors that generate at least three directional error vector signals;
    a directional error selector that selects at least one of the at least three directional errors to be superimposed on the reflected wave of the device under test
    at least three leakage errors that generate at least three leakage error vector signals;
    a leakage error selector that selects at least one of the at least three leakage errors to be superimposed on the transmitted wave of the device under test,
    wherein the scalar measuring instrument comprises a reflected-wave scalar measuring instrument that measures each of the superimposed signals in which the at least three directional error vector signals are superimposed on the reflected wave of the device under test as a scalar value and a transmitted-wave scalar measuring instrument that measures each of the superimposed signals in which the at least three leakage error vector signals are superimposed on the transmitted wave of the device under test as a scalar value.

9. A measuring method for vector-measuring a scattering coefficient of a device under test, the measuring method comprising:
    applying a signal to the device under test;

measuring a reflected wave reflected from the device under test or a transmitted wave transmitted through the device under test;

superimposing two different vector signals on the reflected wave or the transmitted wave of the device under test to obtain at least three superimposed signals;

specifying a relation value of each of the two vector signals as a vector value;

measuring each of the two superimposed signals as two scalar values;

converting the two scalar values into two vector values using the relation values obtained in the step of specifying the relation value of each of the two vector signals; and determining a scattering coefficient of the device under test from one of the two vector values.

10. A measuring apparatus for vector-measuring a scattering coefficient of a device under test, the measuring apparatus comprising:

a signal source that applies a signal to the device under test;

a superimposing signal system that superimposes two different vector signals whose relation values are each specified as a vector value on one of a reflected wave reflected from the device under test and a transmitted wave transmitted through the device under test;

a scalar measuring instrument that measures each of the superimposed signals as a scalar value; and a converter that converts the two scalar values measured by the scalar measuring instrument into two vector values using the specified relation values of the two vector signals and determines a scattering coefficient of the device under test from one of the two vector values.

* * * * *